(12) United States Patent
Kanda et al.

(10) Patent No.: US 10,665,813 B2
(45) Date of Patent: May 26, 2020

(54) DISPLAY DEVICE AND MANUFACTURING METHOD THEREOF

(71) Applicant: Japan Display Inc., Tokyo (JP)

(72) Inventors: Noriyoshi Kanda, Tokyo (JP); Masakazu Kaida, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/537,697

(22) Filed: Aug. 12, 2019

(65) Prior Publication Data

US 2019/0363278 A1 Nov. 28, 2019

Related U.S. Application Data

(63) Continuation of application No. PCT/JP2017/046005, filed on Dec. 21, 2017.

(30) Foreign Application Priority Data

Mar. 7, 2017 (JP) ................................. 2017-042560

(51) Int. Cl.
  *H01L 51/52* (2006.01)
  *H01L 27/32* (2006.01)
  *H01L 51/00* (2006.01)
  *H01L 51/56* (2006.01)

(52) U.S. Cl.
  CPC ...... *H01L 51/5218* (2013.01); *H01L 27/3246* (2013.01); *H01L 51/0023* (2013.01); *H01L 51/5209* (2013.01); *H01L 51/56* (2013.01); *H01L 2251/301* (2013.01); *H01L 2251/308* (2013.01); *H01L 2251/5315* (2013.01); *H01L 2251/558* (2013.01)

(58) Field of Classification Search
  CPC . H01L 51/5218; H01L 51/56; H01L 51/5209; H01L 51/0023
  See application file for complete search history.

(56) References Cited

U.S. PATENT DOCUMENTS

2009/0250244 A1* 10/2009 Tsuda .................. G02F 1/13439
174/126.2

FOREIGN PATENT DOCUMENTS

| JP | 2008-135325 A | 6/2008 |
| JP | 2012-123987 A | 6/2012 |

OTHER PUBLICATIONS

International Search Report dated Mar. 20, 2018 for the corresponding PCT Application No. PCT/JP2017/046005, with partial English translation.

* cited by examiner

*Primary Examiner* — Anthony Ho
(74) *Attorney, Agent, or Firm* — Michael Best & Friedrich LLP

(57) ABSTRACT

Disclosed is a display device having a pixel including a pixel electrode, an electroluminescence layer over the pixel electrode, and an opposing electrode over the electroluminescence layer. The pixel electrode possesses: a first conductive layer including a conductive oxide containing indium and zinc; a second conductive layer over the first conductive layer, the second conductive layer containing silver; and a third conductive layer over the second conductive layer, the third conductive layer including a conductive oxide containing indium and tin. A thickness of the first conductive layer is equal to or more than twice a thickness of the third conductive layer and equal to or less than five times the thickness of the third conductive layer.

13 Claims, 16 Drawing Sheets

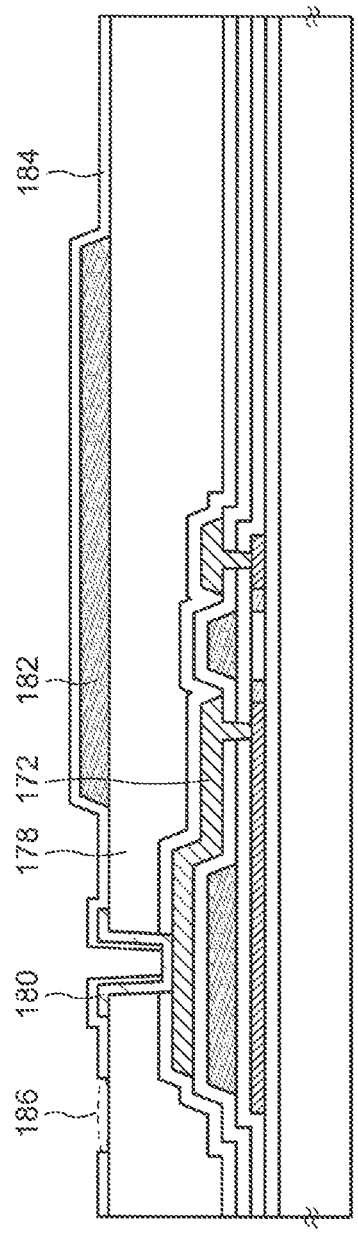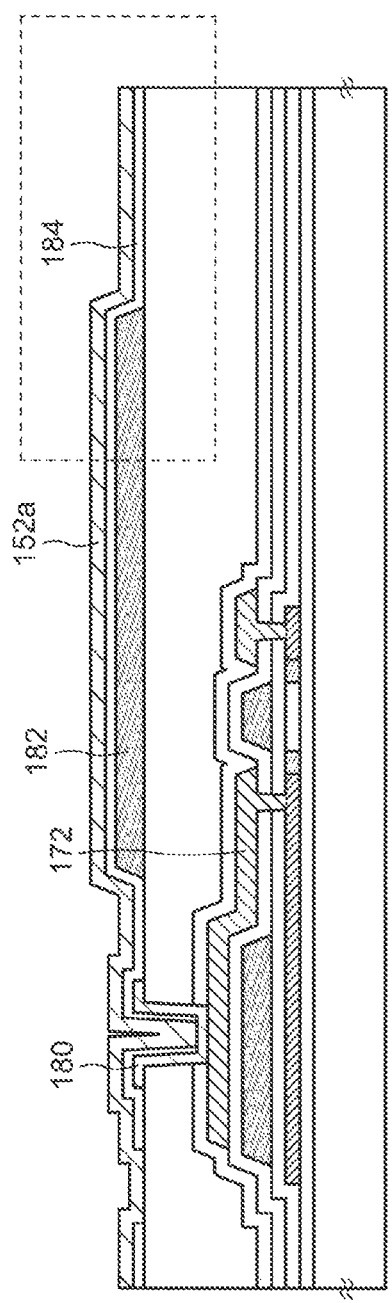

DISPLAY DEVICE AND MANUFACTURING METHOD THEREOF

CROSS REFERENCE TO RELATED APPLICATIONS

This application is based on and claims the benefit of priority from the prior Japanese Patent Application No. 2017-42560, filed on Mar. 7, 2017, and the PCT Application No. PCT/JP2017/046005, filed on Dec. 21, 2017, the entire contents of which are incorporated herein by reference.

FIELD

The present invention relates to a display device and a manufacturing method of the display device. For example, the present invention relates to a pixel electrode of a display device and a manufacturing method thereof.

BACKGROUND

In a display device such as a thin display device, an electrode (pixel electrode) is provided in each of a plurality of pixels formed over a substrate. In a display device having a current-driving type element such as an organic light-emitting element (hereinafter, referred to as a light-emitting element), current is supplied to the light-emitting element through the pixel electrode. The light-emitting element is controlled by a pixel circuit including a driving element such as a transistor disposed in each pixel. When a top-emission type light-emitting element is used, light emitted from the light-emitting element is extracted from a substrate side opposite to a side of a substrate over which the transistor is arranged. In this case, since the pixel electrode connected to the pixel circuit is not required to transmit the light from the light-emitting element, a material with high reflectance is employed. For example, a pixel electrode including a metal with high reflectance to visible light, such as aluminum and silver, is disclosed in Japanese Patent Application Publications No. 2008-135325 and 2012-123987. In Japanese Patent Application Publication No. 2012-123987, a pixel electrode having a structure in which a thin film of silver is sandwiched by indium-tin oxide (ITO) is disclosed.

SUMMARY

An embodiment of the present invention is a display device.

The display device has a pixel including a pixel electrode, an electroluminescence layer over the pixel electrode, and an opposing electrode over the electroluminescence layer. The pixel electrode possesses: a first conductive layer including a conductive oxide containing indium and zinc; a second conductive layer over the first conductive layer, the second conductive layer containing silver; and a third conductive layer over the second conductive layer, the third conductive layer including a conductive oxide containing indium and tin. A thickness of the first conductive layer is equal to or more than twice a thickness of the third conductive layer and equal to or less than five times the thickness of the third conductive layer.

An embodiment of the present invention is a method for manufacturing a display device. The manufacturing method includes: forming a pixel electrode over an insulating film including nitrogen, oxygen, and silicon; forming an electroluminescence layer over the pixel electrode; and forming an opposing electrode over the electroluminescence layer. The formation of the pixel electrode includes: forming a first conductive layer including a conductive oxide containing indium and zinc; forming a second conductive layer over the first conductive layer, the second conductive layer including silver; forming a third conductive layer over the second conductive layer, the third conductive layer including a conductive oxide containing indium and tin; forming a resist over the third conductive layer; etching the third conductive layer with oxalic acid using the resist as a mask; removing the resist; and etching the first conductive layer and the second conductive layer with an aqueous solution including nitric acid, acetic acid, and phosphoric acid by using the third conductive layer as a mask.

An embodiment of the present invention is a method for manufacturing a display device. The manufacturing method includes: forming a pixel electrode over an insulating film including nitrogen, oxygen, and silicon; forming an electroluminescence layer over the pixel electrode; and forming an opposing electrode over the electroluminescence layer. The formation of the pixel electrode includes: forming a first conductive layer including a conductive oxide containing indium and zinc; forming a second conductive layer over the first conductive layer, the second conductive layer including silver; forming a third conductive layer over the second conductive layer, the third conductive layer including a conductive oxide containing indium and tin, forming a resist over the third conductive layer; etching the third conductive layer with oxalic acid using the resist as a mask; and etching the first conductive layer and the second conductive layer with an aqueous solution including nitric acid, acetic acid, and phosphoric acid using the third conductive layer as a mask.

BRIEF DESCRIPTION OF DRAWINGS

FIG. 7A and FIG. 7B are schematic cross-sectional views for explaining a manufacturing method of a display device according to the present invention;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present invention, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the scope of the claims, unless specifically stated, when a state is expressed where a structure is arranged "over" another structure, such an expression includes both a case where the substrate is arranged immediately above the "other structure" so as to be in contact with the "other structure" and a case where the structure is arranged over the "other structure" with an additional structure therebetween.

In the specification and the scope of the claims, an expression that "a structural member is exposed from another structural member" means a mode where a part of the structural member is not covered by the other structural member and includes a mode where the portion of the structural member which is not covered by the other structural member is further covered by another structural member.

First Embodiment

1. Outline Structure

Figure 1:
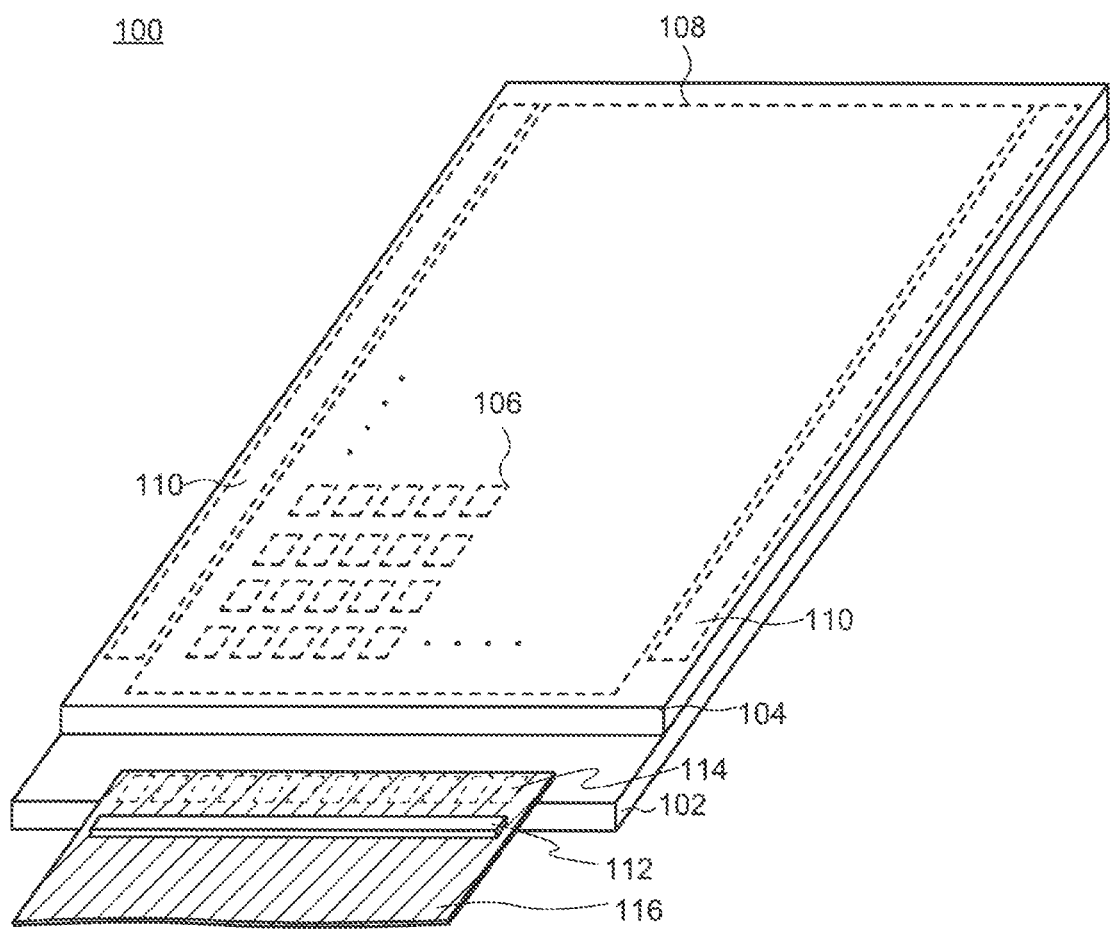
FIG. 1 is a schematic perspective view of a display device according to the present invention.

A schematic perspective view of a display device 100 according to an embodiment of the present invention is shown in FIG. 1. The display device 100 is an organic electroluminescence (EL) display device including a light-emitting element as a display element.

As shown in FIG. 1, the display device 100 has a first substrate 102 over which a display region 108 and scanning-line driver circuits 110 are arranged and a second substrate 104 arranged to cover the display region 108 and the scanning-line driver circuits 110. Wirings which are not illustrated extend from the display region 108 and the scanning-line driver circuits 110 to a side of the first substrate 102 and are exposed at an edge portion of the first substrate 102 to form terminals 114. The terminals 114 can be electrically connected to a flexible printed circuit (FPC) 116, and a driver IC 112 for controlling pixel circuits may be mounted over the FPC 116. Note that the driver IC 112 may not be disposed over the FPC 116 but may be mounted over the first substrate 102. Alternatively, a driver circuit may be formed over the first substrate 102 instead of the driver IC 112.

A plurality of pixels 106 is arranged in a matrix form in the display region 108. A light-emitting element and the pixel circuit for controlling the light-emitting element are disposed in each of the pixels 106. The pixel circuit includes a variety of semiconductor elements such as a transistor and a capacitor and is controlled with signals supplied from an external circuit (not shown) through the scanning-line driver circuits 110 and the driver IC 112. Control of light emission from the light-emitting element allows an image to be displayed on the display region 108.

Figure 2:
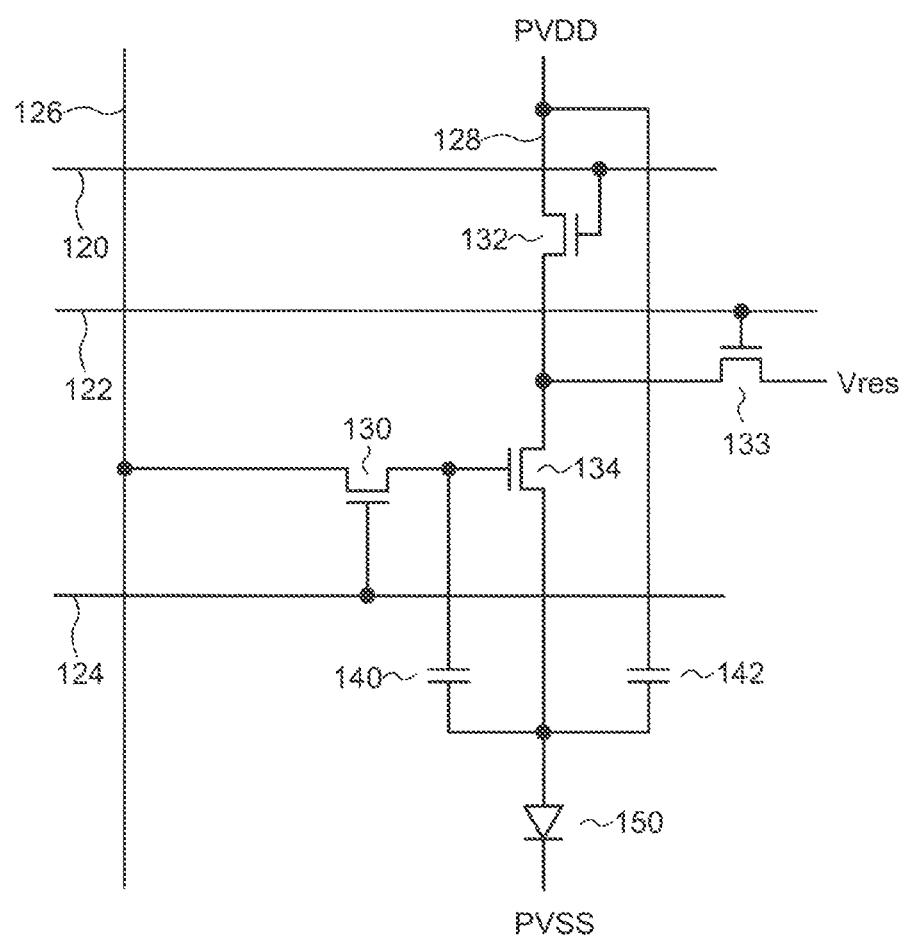
FIG. 2 is an example of an equivalent circuit of a display device according to the present invention.

An example of the pixel circuit is shown as an equivalent circuit in FIG. 2. In the example shown here, each pixel circuit is electrically connected to a first scanning line 120, a second scanning line 122, and a third scanning line 124 extending from the scanning-line driver circuits 110 as well as an image-signal line 126 and a power-source line 128 extending from a side of the driver IC 112. The pixel circuit possesses, as semiconductor elements, four transistors including a switching transistor 130, an output transistor 132, a reset transistor 133, and a driving transistor 134 as well as two capacitors including a storage capacitor 140 and a supplementary capacitor 142. These elements are directly or indirectly connected to the wirings described above. The light-emitting element 150 is controlled by these semiconductor elements. Here, current is supplied to an anode side of the light-emitting element 150 from a high potential PVDD connected to the power-source line 128. The supplied current contributes to emission of the light-emitting element 150 and flows to a low potential PVSS connected to a cathode side. Although not illustrated, the pixel circuit is not limited to the structure shown in FIG. 2 and pixel circuits with a variety of structures may be applied to the display device 100.

2. Cross-Sectional Structure

A structure of the display device 100 is explained by using a cross-sectional structure of the pixel 106. In the schematic cross-sectional view shown in FIG. 3, cross sections of the light-emitting element 150, the driving transistor 134, the storage capacitor 140, and the supplementary capacitor 142 of the pixel circuit shown in FIG. 2 are schematically illustrated.

2-1. Pixel Circuit

The first substrate 102 has a function to support the pixel circuit formed thereover and may include glass, quartz, or a polymer. The second substrate 104 may also include a material the same as that of the first substrate 102. When a polymer such as a polyimide, a polyamide, and a polycarbonate are used for the first substrate 102 and the second substrate 104, flexibility can be provided to the display device 100, which enables production of a so-called flexible display.

The driving transistor 134 and the storage capacitor 140 are arranged over the first substrate 102 through an undercoat 160. The undercoat 160 has a role to block impurities from the first substrate 102 and prevent the entrance of water from outside particularly when the first substrate 102 includes a polymer. An inorganic compound containing silicon can be used for the undercoat 160, for example. Specifically, the undercoat 160 is formed with an inorganic film including a film selected from a silicon nitride film, a silicon oxide film, a silicon nitride oxide film, and a silicon oxynitride film. The undercoat 160 is illustrated so as to have a single-layer structure in FIG. 3. However, the undercoat 160 may be formed by stacking the films described above.

The driving transistor 134 possesses a semiconductor film 162, a gate insulating film 164 over the semiconductor film 162, a gate electrode 166 over the gate insulating film 164, a first interlayer film 168 over the gate electrode 166, and source/drain electrodes 170 and 172 over the first interlayer film 168 and the like. The semiconductor film 162 may have an active region 162a, low-concentration impurity regions 162b sandwiching the active region 162a, and a high-concentration impurity regions 162c sandwiching these regions and the like. The driving transistor 134 is illustrated as a top-gate type transistor in FIG. 3. However, there is no limitation to a structure of the transistor provided in the pixel circuit, and transistors with a variety of structures may be utilized.

The storage capacitor 140 is configured by a part of the semiconductor film 162 (the high-concentration impurity region 162c), the gate insulating film 164 thereover, a capacitor electrode 174 existing in the same layer as the gate electrode 166, the first interlayer film 168 over the capacitor 174, and a part of the source/drain electrode 172. Here, the gate insulating film 164 and the first interlayer film 168 function as a dielectric of the storage capacitor 140.

A second interlayer film 176 may be formed as an optional structure over the driving transistor 134 and the storage capacitor 140. The undercoat 160, the gate insulating film 164, the first interlayer film 168, and the second interlayer film 176 may contain silicon oxide, silicon nitride, silicon oxynitride and silicon nitride oxide or the like. These films may have a single-layer structure or a stacked-layer structure.

A leveling film 178 is further provided over the driving transistor 134 and the storage capacitor 140. Depressions and projections caused by the driving transistor 134 and the storage capacitor 140 are absorbed by the leveling film 178, thereby giving a flat surface. The leveling film 178 may include a polymer exemplified by an acrylic resin, an epoxy resin, a polysiloxane, a polyimide and a polyamide and the like.

An opening reaching the source/drain electrode 172 is prepared in the leveling film 178 and the second interlayer film 176, and a connection electrode 180 covering this opening and a part of the leveling film 178 is formed so as to be in contact with the source/drain electrode 172. A supplementary capacitor electrode 182 is further provided over the leveling film 178, and an insulating film 184 is formed to cover the connection electrode 180 and the supplementary capacitor electrode 182. The insulating film 184 does not cover a part of the connection electrode 180 in the opening formed in the leveling film 178 to expose a bottom surface of the connection electrode 180. This configuration allows electrical contact between a pixel electrode 152 formed over the insulating film 184 and the connection electrode 180. An opening 186 may be formed in the insulating film 184 to allow contact of a partition wall 190 formed thereover with the leveling film 178. A silicon-containing inorganic compound described above may be used for the insulating film 184, and silicon nitride including nitrogen, oxygen and silicon is typically used. Note that the formation of the connection electrode 180 and the opening 186 is optional. Formation of the connection electrode 180 prevents oxidation of a surface of the source/drain electrode 172 in the following processes, thereby suppressing an increase in contact resistance caused by the oxidation. The opening 186 is capable of functioning as an opening for releasing impurities such as oxygen and water from the leveling film 178, which enables improvement of reliability of the semiconductor elements and the light-emitting element 150 in the pixel circuit.

The pixel electrode 152 of the light-emitting element 150 is prepared over the insulating film 184 so as to cover the connection electrode 180 and the supplementary capacitor electrode 182. The pixel electrode 152 is electrically connected to the source/drain electrode 172 in the opening formed in the leveling film 178 through the connection electrode 180. The insulating film 184 is sandwiched by the supplementary electrode 182 and the pixel electrode 152, and the supplementary capacitor 142 is formed by this structure. A potential of the gate electrode 166 can be stabilized by capacitance of the supplementary capacitor 142 and the storage capacitor 140. The pixel electrode 152 is shared by the supplementary capacitor 142 and the light-emitting element 150.

2-2. Light-Emitting Element

The partition wall 190 covering an edge portion of the pixel electrode 152 is formed over the pixel electrode 152. A portion of the pixel electrode 152 other than a portion covered by the partition wall 190 is exposed from the partition wall 190. In other words, the partition wall 190 is an insulating film having an opening portion, and the pixel electrode 152 is exposed from the partition wall 190 and in contact with an electroluminescence layer 154 described below in the opening portion. The partition wall 190 may include a polymer such as an acrylic resin and an epoxy resin and has a function to insulate adjacent pixels 106 from each other and absorb depressions and projections caused by the opening prepared in the leveling film 178, the supplementary electrode 182 and the pixel electrode 152 and the like.

Figure 3:
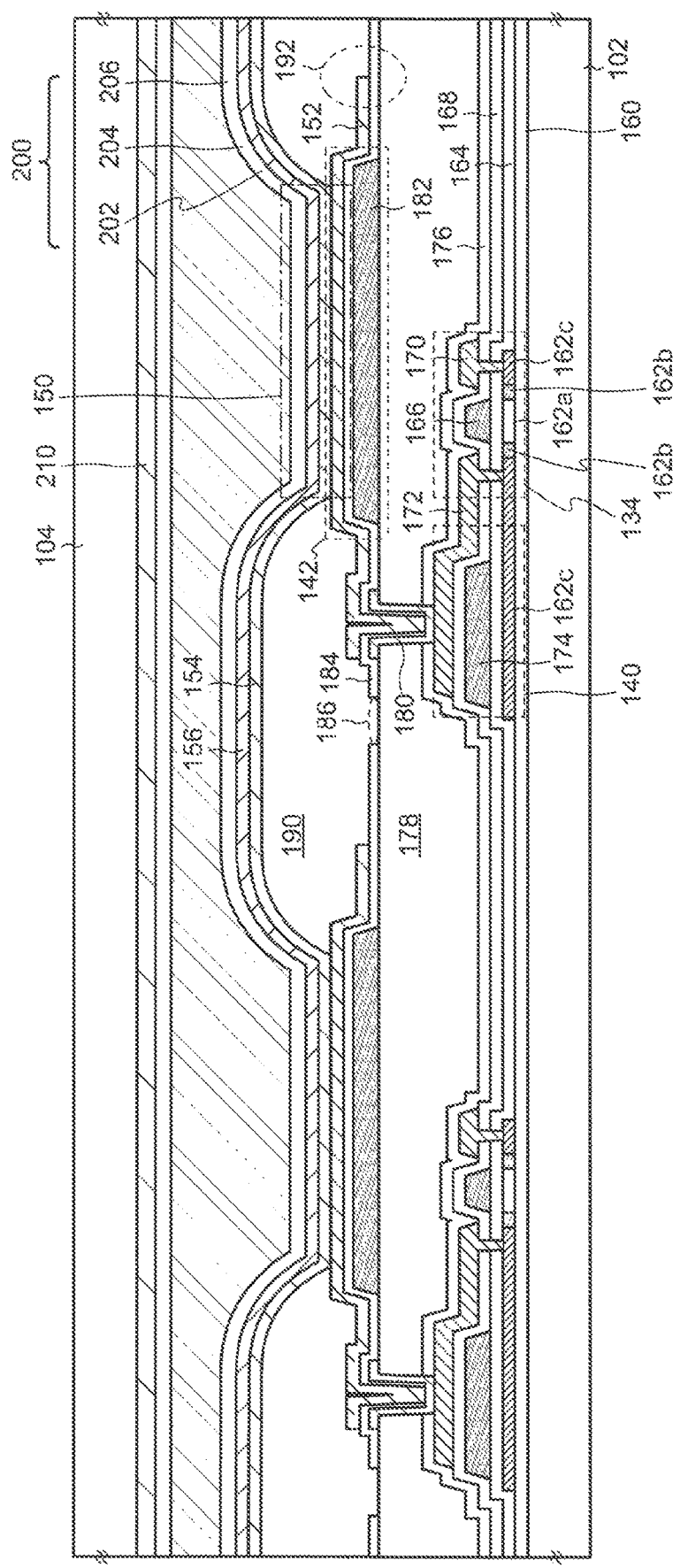
FIG. 3 is a schematic cross-sectional view of a display device according to the present invention.
Figure 4:
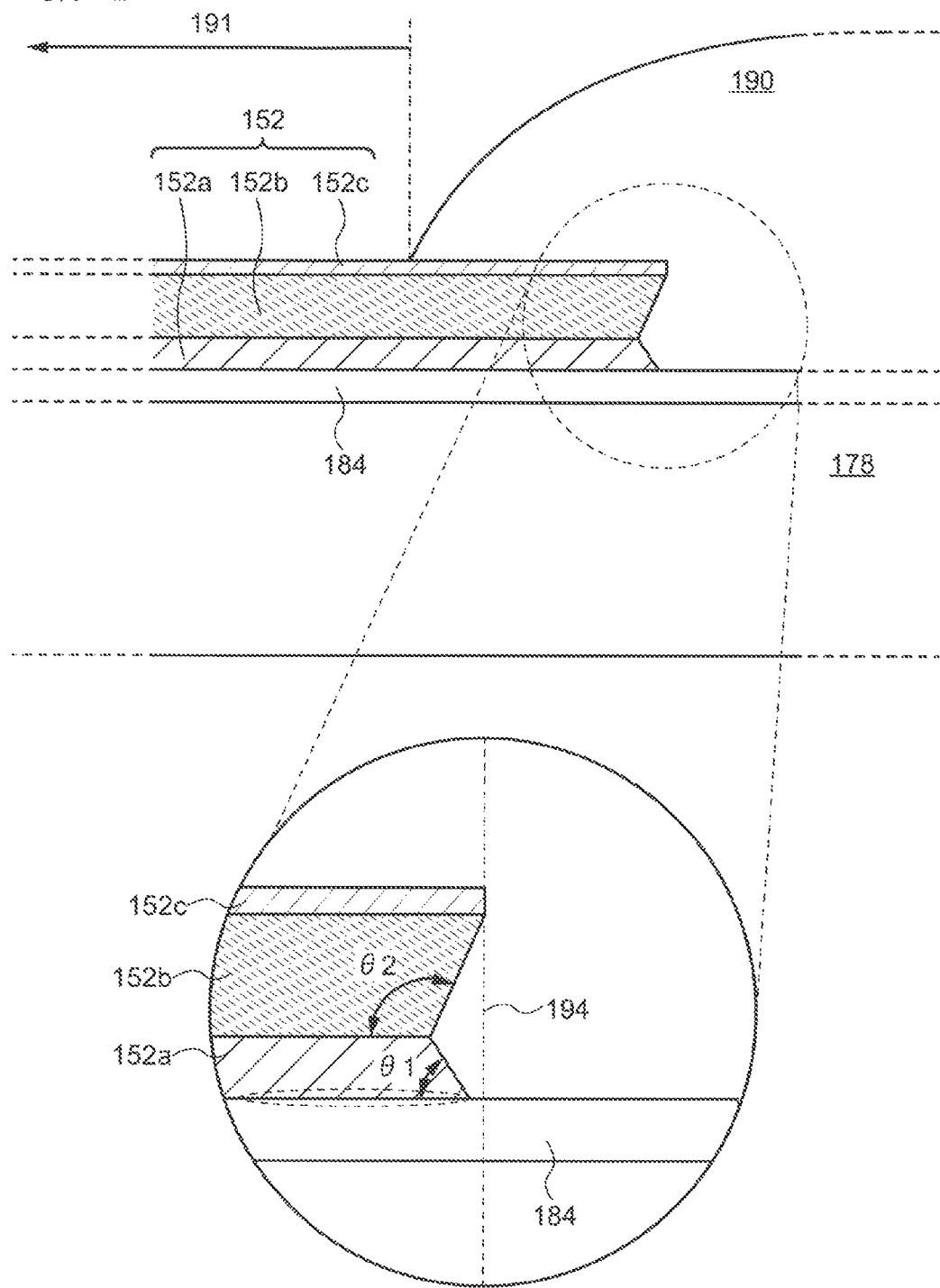
FIG. 4 is a schematic cross-sectional view of a pixel electrode in a pixel of a display device according to the present invention.

The structure of the edge portion of the pixel electrode 152 is shown in FIG. 4. FIG. 4 is an enlarged figure of a region 192 in FIG. 3. As shown in FIG. 4, the pixel electrode 152 has a three-layer structure. Specifically, the pixel electrode 152 is structured by a first conductive layer 152a in contact with an upper surface of the insulating film 184, a second conductive layer 152b over and in contact with the first conductive layer 152a, and a third conductive layer 152c over and in contact with the second conductive layer 152b.

It is preferred that the first conductive layer 152a have conductivity and include a material having preferred adhesion to the insulating film 184 located thereunder. Furthermore, it is preferred to include a material with a higher etching rate than a material included in the third conductive layer 152c when the same etchant is used under the same conditions. The etching rate of the first conductive layer 152a is preferably equal to or higher than three times and equal to or lower than fifty times, equal to or higher than three times and equal to or lower than twenty times, or equal to or higher than three times and equal to or less than fifteen times that of the third conductive layer 152c. Specifically, a conductive oxide (IZO) including indium and zinc can be used for the first conductive layer 152a. A composition ratio of indium and zinc may be arbitrarily determined, and it is not always necessary that the composition ratio is substantially an integral ratio. As the etchant described above, an aqueous solution including phosphoric acid, acetic acid, and nitric acid, and an aqueous solution of oxalic acid and the like are represented. The former is also called a mixed acid and is prepared to have a concentration range of 30 vol % to 70 vol % of phosphoric acid, 0.3 vol % to 10 vol % of nitric acid, and 20 vol % to 50 vol % of acetic acid, for example.

The first conductive layer 152a may have a relatively large thickness. Specifically, the first conductive layer 152a is formed so as to have a thickness of equal to or more than 30 nm and equal to or less than 100 nm, equal to or more than 40 nm and equal to or less than 100 nm, or equal to or more than 50 nm and equal to or less than 100 nm, and typically 50 nm after etching the first conductive layer 152a and the second conductive layer 152c as described below. As described below, silver or an alloy thereof can be used for the second conductive layer 152b. However, when silicon nitride is included in the insulating film 184, adhesion between silver and silicon nitride is low. Therefore, when the second conductive layer 152b is formed over the insulating film 184 without the use of the first conductive layer 152a, the pixel electrode 152 is readily peeled. On the other hand, the use of the first conductive layer 152a prevents the pixel electrode 152 from being peeled because an oxide such as IZO has relatively high adhesion to silicon nitride. Additionally, it is possible to obtain high adhesion to the insulating film 184 by forming the first conductive layer 152a at the thickness described above.

The second conductive layer 152b preferably has high reflectance to visible light and may include 0-valent silver, aluminum, or an alloy thereof, for example. A thickness of the second conductive layer 152b may be equal to or more than 100 nm and equal to or less than 200 nm, equal to or more than 120 nm and equal to or less than 160 nm, or equal to or more than 120 nm and equal to or less than 140 nm, and typically 130 nm. Since such a thickness does not allow visible light to pass therethrough, the second conductive layer 152b exhibits high reflectance. Therefore, the light emission obtained from the light-emitting element 150 is effectively reflected and can be extracted through the second substrate 104.

The third conductive layer 152c has a transmitting property with respect to visible light and may typically include ITO. A thickness of the third conductive layer 152c may be equal to or more than 5 nm and equal to or less than 25 nm or equal to or more than 10 nm and equal to or less than 20 nm, and typically 15 nm. It is preferred that the thickness of the third conductive layer 152c be smaller than the thickness of the first conductive layer 152a and may be equal to or more than one fifth and equal to or less than one half, equal to or more than one fourth and equal to or less than one half, or equal to or more than one fourth and equal to or less than one third the thickness of the first conductive layer 152a. For example, when the thickness of the first conductive layer 152a is 50 nm, the thickness of the third conductive layer 152c may be set to be 15 nm.

The first conductive layer 152a may be formed so that an edge portion has a taper shape. That is, the first conductive layer 152a may be formed so that a taper angle θ1 of the edge portion of the first conductive layer 152a is larger than 0° and smaller than 90°. Here, a taper angle of a film means an angle between a side (hereinafter, referred to as a common side) shared by two films and a side surface of the film on an upper side in a cross section of the two films stacked and in contact with each other. When this angle is larger than 0° and smaller than 90°, it is defined that the upper film has a taper structure. On the other hand, when this angle is larger than 90° and smaller than 180°, it is defined that the upper film has a reverse taper shape. Therefore, as shown in the enlarged cross-sectional view of FIG. 4, the common side between the first conductive layer 152a and the insulating film 184 thereunder is the side surrounded by a dotted ellipse in the enlarged figure, and the angle between the common side and a side surface of the first conductive layer 152a is the taper angle θ1. As described above, θ1 may be larger than 0° and smaller than 90°.

On the other hand, the second conductive layer 152b may have a reverse taper structure, and a taper angle 92 thereof can be larger than 90° and smaller than 180°. Note that the pixel electrode 152 may be formed so that whole of the first conductive layer 152a and the second conductive layer 152b are covered by the third conductive layer 152c. In this case, edge portions of the first conductive layer 152a and the second conductive layer 152b are located closer to the opening portion 191 of the partition wall 190 compared with an edge portion of the third conductive layer 152c. In other words, the pixel electrode 152 may be formed so that a normal line 194 passing through the edge portion of the third conductive layer 152c does not intersect nor pass through the first conductive layer 152a and the second conductive layer 152b.

Figure 5:
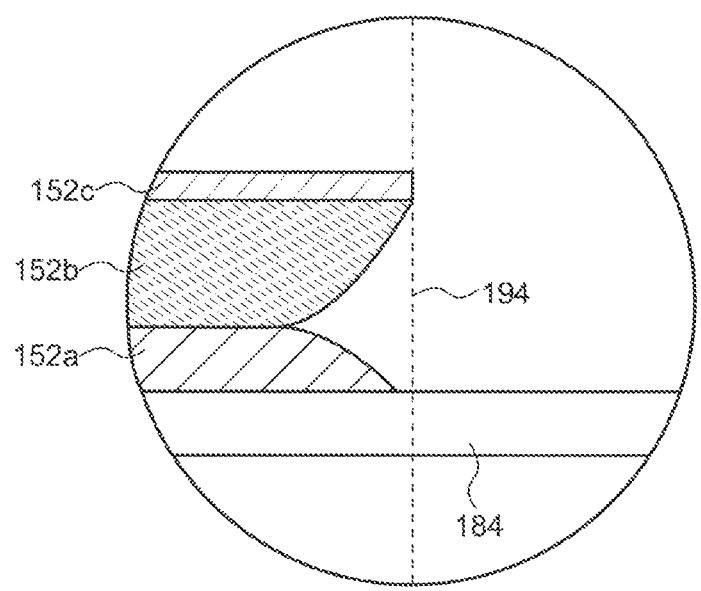
FIG. 5 is a schematic cross-sectional view of a pixel electrode in a pixel of a display device according to the present invention.

It is not necessary that the side surfaces of the first conductive layer 152a and the second conductive layer 152b each provide a straight line in a cross section as shown in FIG. 4. For example, these side surfaces may be a curved surface and may be expressed by a curve in a cross section as shown in FIG. 5. In this case, the taper angle is defined as an angle between an arbitrarily selected tangent on the side surface and the common side in the cross section.

Referring to FIG. 3, the electroluminescence layer (hereinafter, referred to as an EL layer) 154 and an opposing electrode 156 over the EL layer 154 of the light-emitting element 150 are provided so as to cover the pixel electrode 152 and the partition wall 190. The light-emitting element 150 is structured by the pixel electrode 152, the EL layer 154, and the opposing electrode 156. In the present specification and claims, the EL layer 154 means all the layers disposed between the pixel electrode 152 and the opposing electrode 156. Carriers (electrons and holes) are injected to the EL layer 154 from the pixel electrode 152 and the opposing substrate 156, and light emission is obtained through a radiative deactivation process from an excited state generated by recombination of the carriers.

The EL layer 154 is illustrated so as to have a single-layer structure in FIG. 3. However, the EL layer 154 may be composed of a plurality of layers and formed by combining layers having a variety of functions, such as a carrier-injection layer, a carrier-transporting layer, an emission layer, a carrier-blocking layer, and an exciton-blocking layer. The structure of the EL layer 154 may be the same in all of the pixels, or the EL layer 154 may be formed so that the structure thereof is different between adjacent pixels 106. For example, the EL layer 154 is formed so as to have a different structure and material of the emission layer between adjacent pixels 106 by which emissions with different colors can be obtained from adjacent pixels 106. When the same EL layer 154 is employed in all the pixels 106, a plurality of emission colors is obtained by providing a color filter on the second substrate 104.

The opposing electrode 156 has a transmitting property with respect to visible light and can be formed by using a conductive oxide with a light-transmitting property, such as ITO and IZO. Alternatively, the opposing electrode 156 may be formed by forming silver, aluminum, or an alloy thereof at a thickness which allows visible light to transmit therethrough.

2-3. Other Structures

As an optional structure, a protection film (hereinafter, referred to as a passivation film) 200 may be provided over the light-emitting element 150. The structure of the passivation film 200 may be arbitrarily selected. For example, a stacked structure having a first layer 202 including an inorganic compound, a second layer 204 including an organic compound, and a third layer 206 including an inorganic compound can be applied to the passivation film 200 as shown in FIG. 3. In this case, the aforementioned inorganic compound including silicon may be used as an inorganic compound. As an organic compound, a polymer such as an epoxy resin and an acrylic resin may be used.

The second substrate 104 is fixed to the first substrate 102 with a sealing material 210 so as to sandwich the light-emitting element 150 and the pixel circuit. With this step, the light-emitting element 150 and the pixel circuit are sealed.

As described above, the thickness of the first conductive layer 152a is relatively large in the pixel electrode 152 of the pixel 106 in the display device 100. Therefore, high adhesion can be secured between the first conductive layer 152a and the insulating film 184 in contact with the first conductive layer 152a. Therefore, peeling does not occur in all or a part of the pixel electrodes 152 during the manufacturing process of the display device 100, and a defect caused by disconnection or generation of a foreign object can be effectively suppressed, by which the yield and reliability of the display device 100 can be improved.

On the other hand, the third conductive layer 152c has a function to transmit the light reflected by the second conductive layer 152b and may include ITO, IZO, or the like as descried above. However, ITO and IZO have absorption properties in the visible light region to some extent. Therefore, the thickness of the third conductive layer 152c is reduced as described above, thereby decreasing the influence of the absorption by the third conductive layer 152c. As a result, it is possible to prevent a reduction in efficiency of the light-emitting element 150 and decrease power consumption of the display device 100. Additionally, a reduction of the thickness of the third conductive layer 152c enables a reduction of an optical distance between the EL layer 154 and the second conductive layer 152b. Hence, contribution of the third conductive layer 152c to the interference of the emission from the EL layer 154 can be decreased, which allows the optical design of the light-emitting element 150 to be readily conducted by using the structure of the EL layer 154.

In addition, as described in the Second Embodiment, the etching rates of the materials included in the first conductive layer 152a and the third conductive layer 152c are adjusted as described above, thereby effectively suppressing generation of a foreign object caused by the etching process. Hence, application of the present embodiment enables production of a display device with high reliability at a high yield.

Second Embodiment

In the present embodiment, a manufacturing method of the display device 100 is explained mainly focusing on the manufacturing method of the pixel electrode 152. An explanation of the structures the same as those of the First Embodiment may be omitted.

Figure 6A:
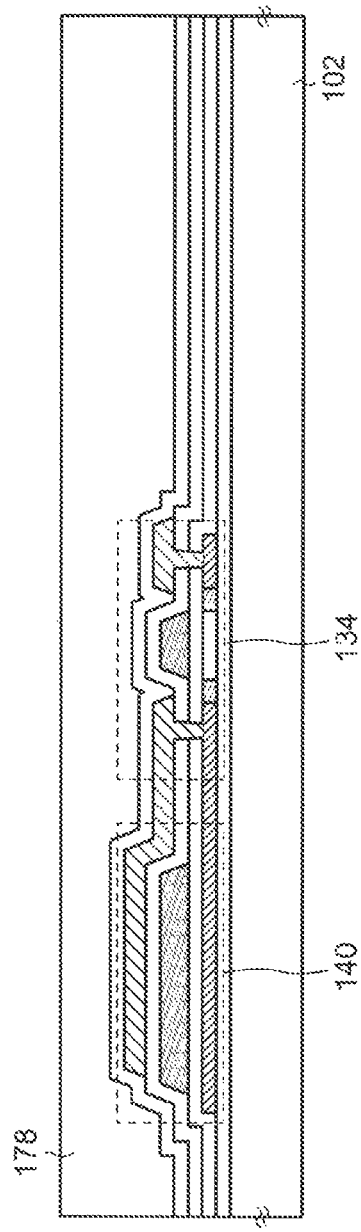
FIG. 6A and FIG. 6B are schematic cross-sectional views for explaining a manufacturing method of a display device according to the present invention.

FIG. 6A is a cross-sectional view corresponding to FIG. 3 and shows a state where the structures up to the driving transistor 134, the storage capacitor 140, and the leveling film 178 over these elements are formed over the first substrate 102. Since the driving transistor 134, the storage capacitor 140, and the leveling film 178 can be fabricated by applying known materials and methods, an explanation is omitted.

1. Supplementary Capacitor

Figure 6B:
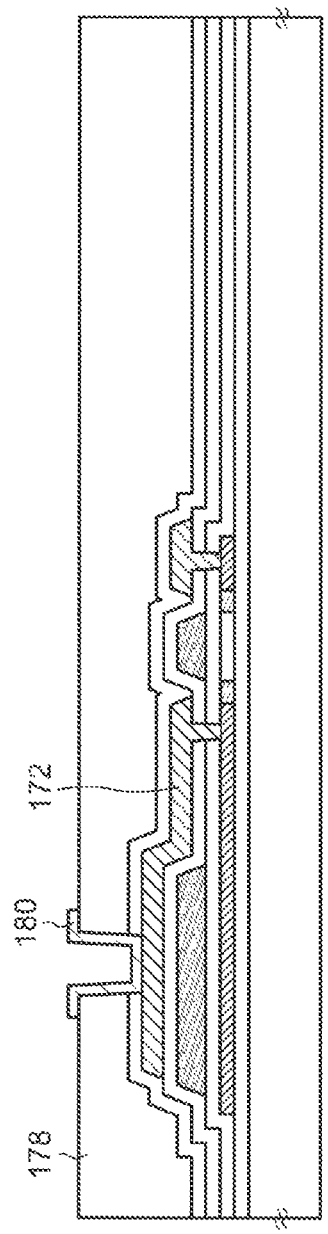

Etching is conducted on the leveling film 178 to form the opening exposing the source/drain electrode 172. After that, the connection electrode 180 is formed over the leveling film 178 to cover the opening and to be in contact with the source/drain electrode 172 (FIG. 6B). The connection electrode 180 may be formed with a sputtering method by using a conductive oxide having a light-transmitting property, such as ITO and IZO.

Next, the supplementary capacitor electrode 182 is formed over the leveling film 178 (FIG. 7A). The supplementary capacitor electrode 182 may include titanium, tungsten, molybdenum, aluminum, or copper or the like and may be formed to have a single-layer structure or a stacked-layer structure. The supplementary capacitor electrode 182 is typically formed by applying a sputtering method or a metal-organic chemical vapor deposition (MOCVD method), or the like.

The insulating film 184 functioning as a dielectric of the supplementary capacitor 142 is formed over the supplementary capacitor electrode 182. The insulating film 184 may be formed by applying a chemical vapor deposition method (CVD method) and may include a silicon-containing inorganic compound such as silicon nitride as described above. The insulating film 184 is prepared so as to cover the connection electrode 180 and the supplementary capacitor electrode 182 and then subjected to etching, by which the bottom surface of the connection electrode 180 is exposed and the opening 186 is formed. The supplementary capacitor electrode 182 and the insulating film 184 of the supplementary capacitor 142 are formed by the processes up to this point.

2. Pixel Electrode

After that, the pixel electrode 152 is formed over the insulating film 184. Specifically, the first conductive layer 152a is formed so as to be in contact with the insulating film 184. At this time, the first conductive layer 152a is formed so as to be in contact with the connection electrode 180 (FIG. 7B). For example, the first conductive layer 152a may be prepared by applying a sputtering method using IZO as a target at a thickness described in the First Embodiment.

Figure 8A:
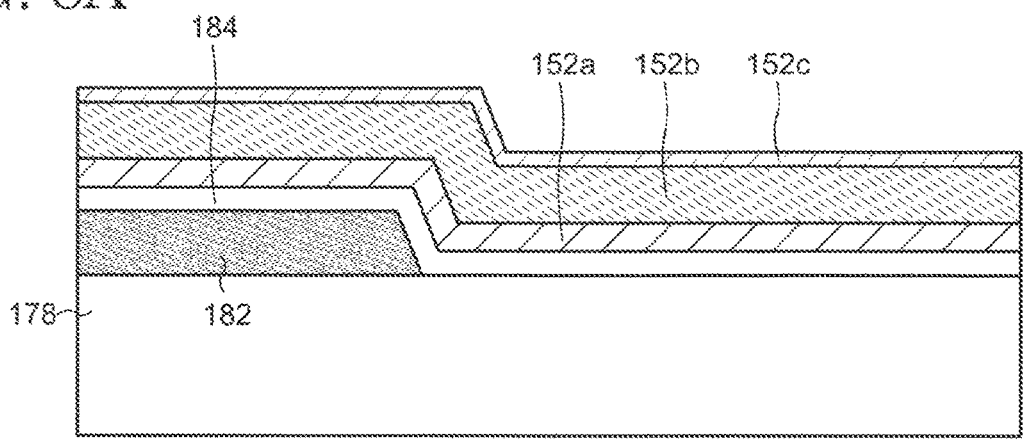
FIG. 8A to FIG. 8C are schematic cross-sectional views for explaining a manufacturing method of a display device according to the present invention.

Next, as shown in an enlarged figure (FIG. 8A) of a region surrounded by dotted lines in FIG. 7B, the second conductive layer 152b and the third conductive layer 152c are sequentially formed over the first conductive layer 152a. The second conductive layer 152b may include silver or an alloy thereof and is formed by applying an evaporation method, a sputtering method or a MOCVD method, or the like. The third conductive layer 152c can be formed by applying a sputtering method using ITO as a target at a thickness described in the First Embodiment.

Figure 8B:
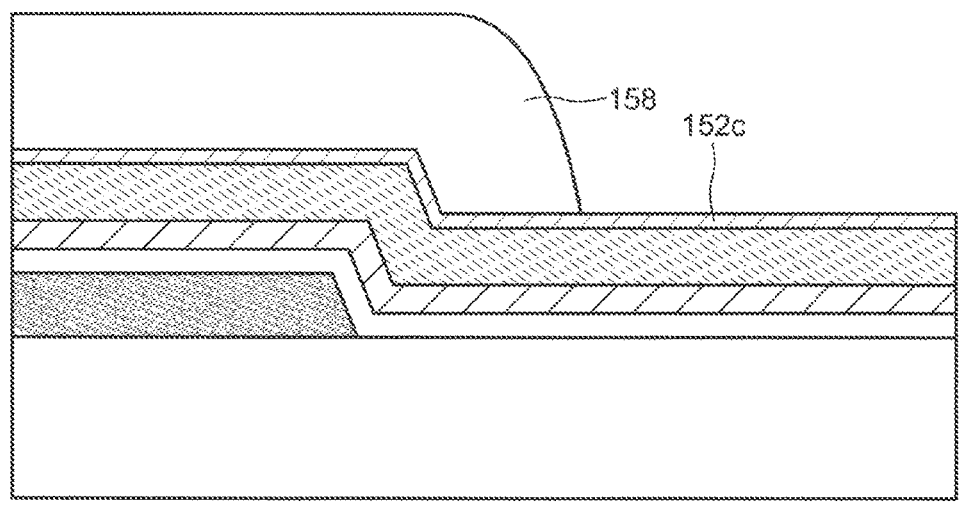
Figure 8C:
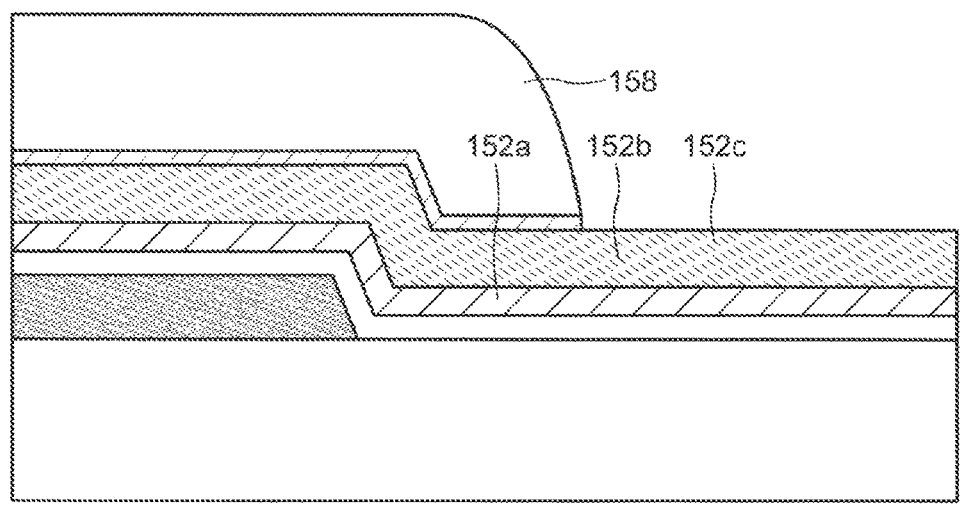

Next, a resist 158 is formed so as to be in contact with the third conductive layer 152c (FIG. 8B). A pattern of the resist 158 corresponds to the shape of the pixel electrode 152. Next, the third conductive layer 152c is preferentially patterned by using the resist 158 as a mask (FIG. 8C). In this example, the third conductive layer 152c is patterned with wet etching using oxalic acid as an etchant. Here, the etching rate of ITO in oxalic acid is extremely high compared with that of silver. Therefore, in a region exposed from the resist 158, the second conductive layer 152b and the first conductive layer 152a covered by the second conductive layer 152b are scarcely etched and substantially maintain their initial shapes, while the third conductive layer 152c is preferentially patterned.

Figure 9A:
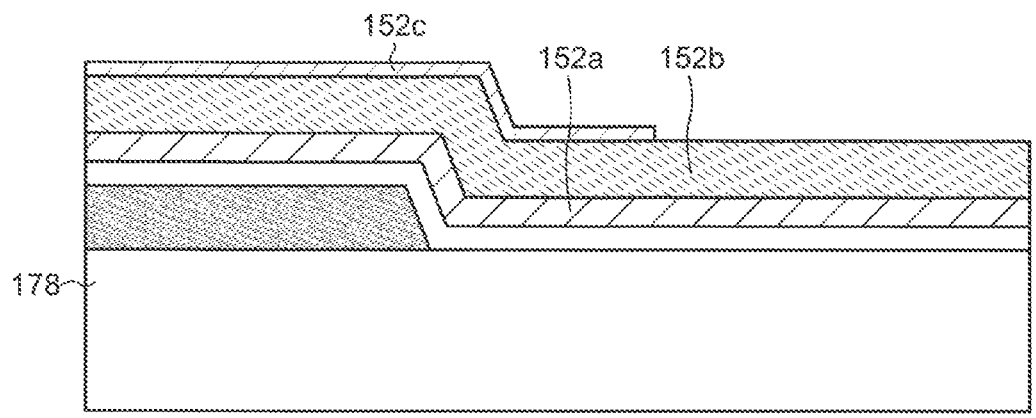
FIG. 9A and FIG. 9B are schematic cross-sectional views for explaining a manufacturing method of a display device according to the present invention.
Figure 9B:
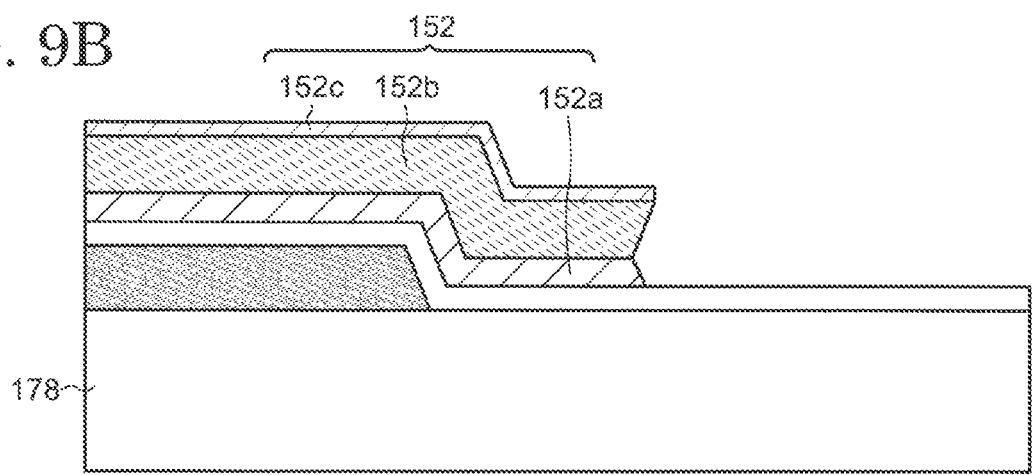

Next, the resist 158 is removed (FIG. 9A), and the second conductive layer 152b and the first conductive layer 152a are simultaneously etched using the exposed third conductive layer 152c as a mask. Specifically, etching is carried out using a mixed acid as an etchant. Silver is etched by a mixed acid, and ITO structuring the third conductive layer 152c is exposed to a mixed acid to be etched. However, the etching rate of ITO is lower than those of silver and IZO. Hence, although a reduction in thickness occurs in the third conductive layer 152c, its area scarcely changes and the second conductive layer 152b is preferentially patterned. In contrast, the etching rate of IZO with a mixed acid is higher than that of ITO. Thus, the first conductive layer 152a is patterned so as to correspond to the shape of the third conductive layer 152c without a significant reduction of the thickness of the third conductive layer 152c even if the thickness of the first conductive layer 152a is larger than that of the third conductive layer 152c (FIG. 9B).

As described above, the use of a difference in etching rate in a mixed acid allows the first conductive layer 152a and the second conductive layer 152b to be patterned while maintaining their planer shapes even if the third conductive layer 152c having a relatively small thickness is used as a mask. With this procedure, the pixel electrode 152 can be formed so as to correspond to the pattern of the resist 158. Note that, although the reason is not clear, it was experimentally confirmed by the inventors that this method provides the pixel electrode 152 in which the first conductive layer 152a has a taper shape and the second conductive layer 152b has a reverse taper shape as shown in FIG. 9B.

3. Other Structures

Figure 10A:
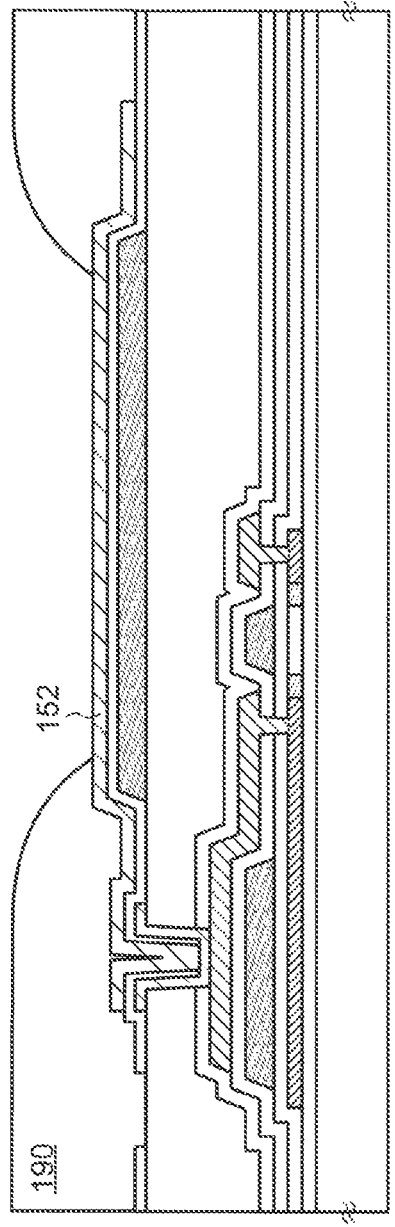
FIG. 10A and FIG. 10B are schematic cross-sectional views for explaining a manufacturing method of a display device according to the present invention.

Next, the partition wall 190 is formed so as to cover the edge portion of the pixel electrode 152 (FIG. 10A). The partition wall 190 is formed with a wet-type film-forming method such as a spin-coating method, an ink-jet method, and a spray method using a polymer such as an acrylic resin, an epoxy resin, a polyimide, or a polysiloxane.

Figure 10B:
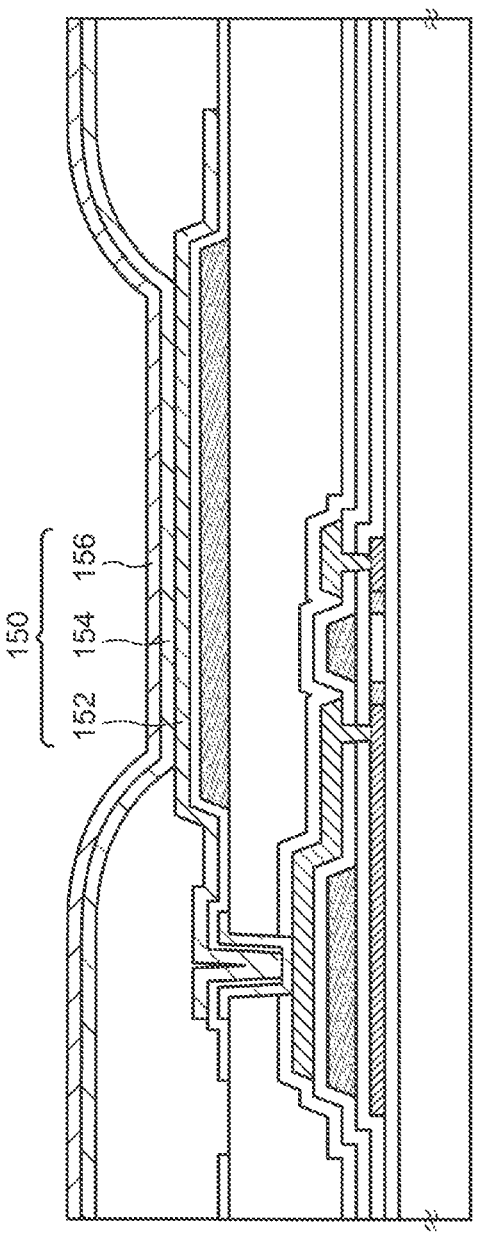

Next, the EL layer 154 and the opposing electrode 156 are sequentially formed so as to overlap with the pixel electrode 152 and the partition wall 190 (FIG. 10B). The EL layer 154 can be formed with an evaporation method or a wet-type film-formation method, and the opposing electrode 156 can be formed with an evaporation method or a sputtering method. With this process, the light-emitting element 150 is formed.

Figure 11:
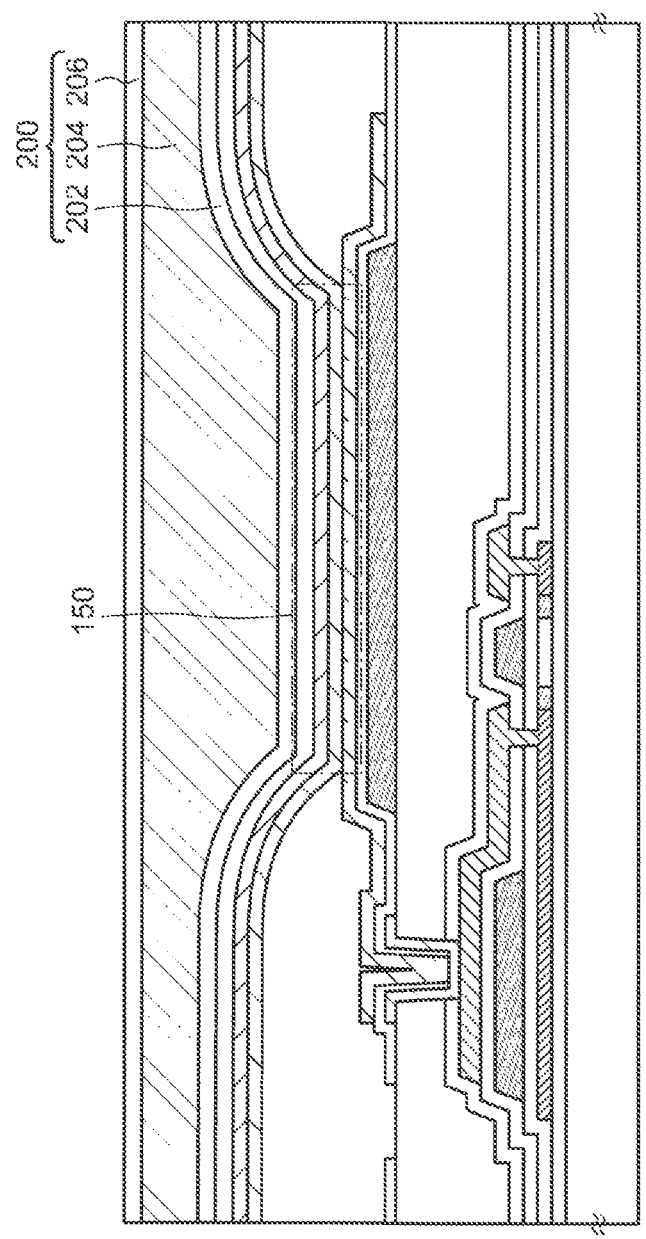
FIG. 11 is a schematic cross-sectional view for explaining a manufacturing method of a display device according to the present invention.

As an optional structure, the passivation film 200 may be fabricated over the light-emitting element 150. When the passivation film 200 having the three-layer structure described in the First Embodiment is prepared, the second layer 204 is formed with a wet-type film-formation method after forming the first layer 202 with a CVD method, which is followed by the formation of the third layer 206 with a CVD method, for example (FIG. 11). After that, the second substrate 104 is fixed over the first substrate 102 with the sealing material 210, resulting in the display device 100 shown in FIG. 3.

4. Modified Example 1

In the aforementioned manufacturing method, the pixel electrode 152 is formed by removing the resist 158 after patterning the third conductive layer 152c, followed by patterning the first conductive layer 152a and the second conductive layer 152b. The present embodiment is not limited to this method, and the pixel electrode 152 can be formed with a different method.

Figure 12A:
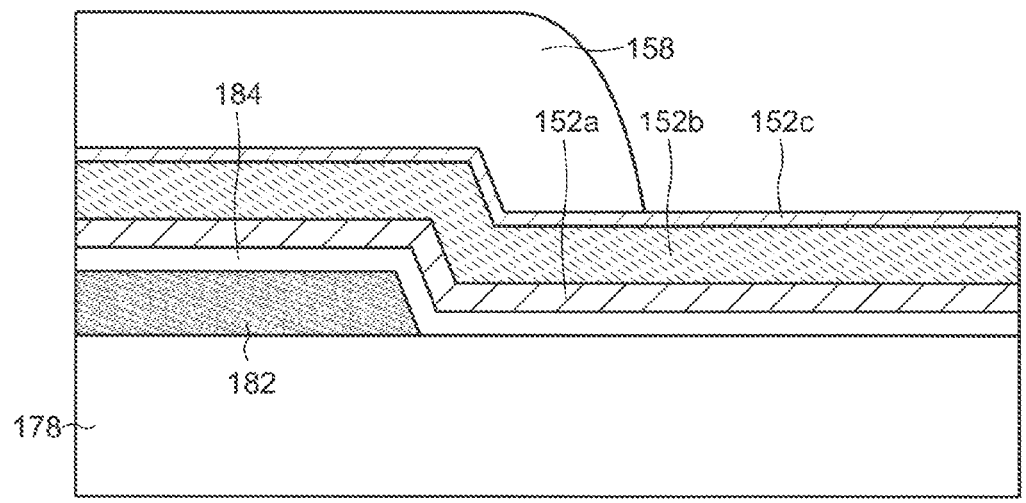
FIG. 12A and FIG. 12B are schematic cross-sectional views for explaining a manufacturing method of a display device according to the present invention.
Figure 12B:
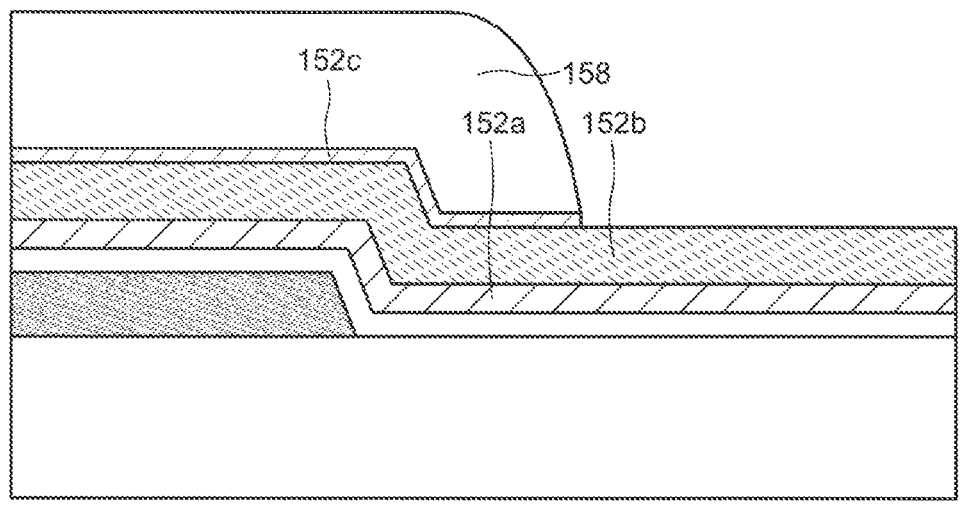
Figure 13A:
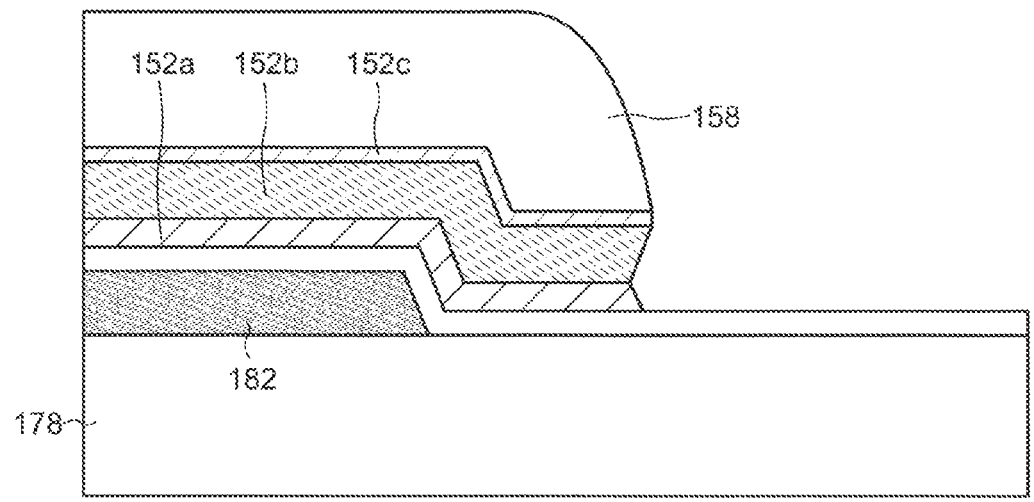
FIG. 13A and FIG. 13B are schematic cross-sectional views for explaining a manufacturing method of a display device according to the present invention.
Figure 13B:
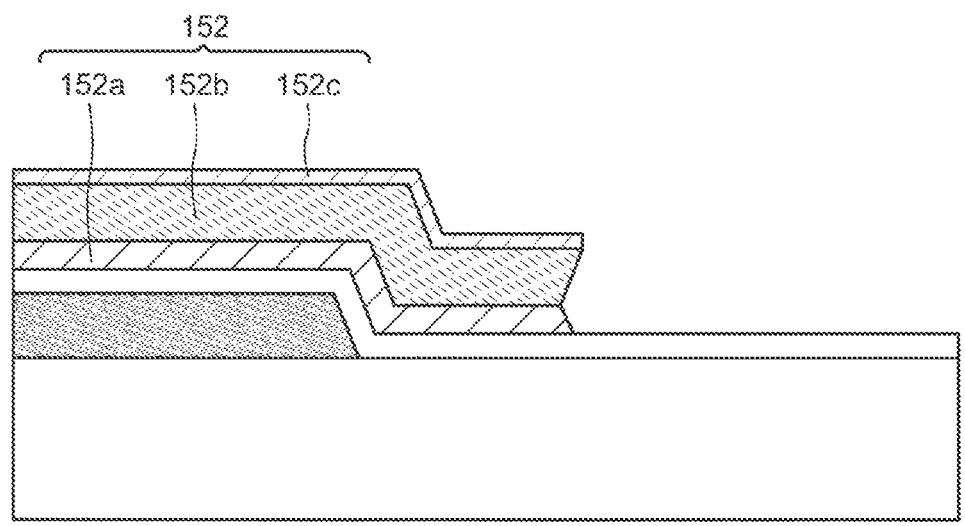

Specifically, as shown in FIG. 12A and FIG. 12B, the resist 158 is formed in the region corresponding to the pixel electrode 152, and then the third conductive layer 152c is preferentially patterned by using the resist 158 and oxalic acid as a mask and an etchant, respectively. After that, the first conductive layer 152a and the second conductive layer 152b are patterned by using a mixed acid without removing the resist 158 (FIG. 13A). Finally, the resist 158 is removed, resulting in the pixel electrode 152 (FIG. 13B).

5. Modified Example 2

As described above, when the first conductive layer 152a, the second conductive layer 152b, and the third conductive electrode 152c are formed with IZO, silver, and ITO, respectively, it is possible to collectively pattern these three layers with etching by using a mixed acid.

In the state shown in FIG. 12A, the third conductive layer 152c is etched with a mixed acid, and then the second conductive layer 152b and the first conductive layer 152a are etched. At this time, since the etching rate of the third conductive layer 152c in a mixed acid is lower than the etching rate of the third conductive layer 152c in oxalic acid, patterning can be performed without any problem although the etching time is prolonged. Additionally, the etching rate of the third conductive layer 152c in a mixed acid is significantly lower than the etching rate of the second conductive layer 152b in a mixed acid and lower than the first conductive layer 152a in a mixed acid. Therefore, the third conductive layer 152c can sufficiently maintain its shape during the patterning of the second conductive layer 152b and the first conductive layer 152a (FIG. 13A).

Through these processes, the shape of the pixel electrode 152 shown in FIG. 13B is eventually obtained even if the patterning is conducted by using only a mixed acid.

6. Comparable Example

As described above, according to the manufacturing method of the pixel electrode 152 of the present embodiment, IZO and ITO are respectively used for the first conductive layer 152a and the third conductive layer 152c, and the third conductive layer 152c is formed so as to have a smaller thickness than the first conductive layer 152a. After that, the third conductive layer 152c is etched with oxalic acid. Next, the etching with a mixed acid is simultaneously conducted on the first conductive layer 152a and the second conductive layer 152b by using the third conductive layer 152c as a mask.

Figure 14:
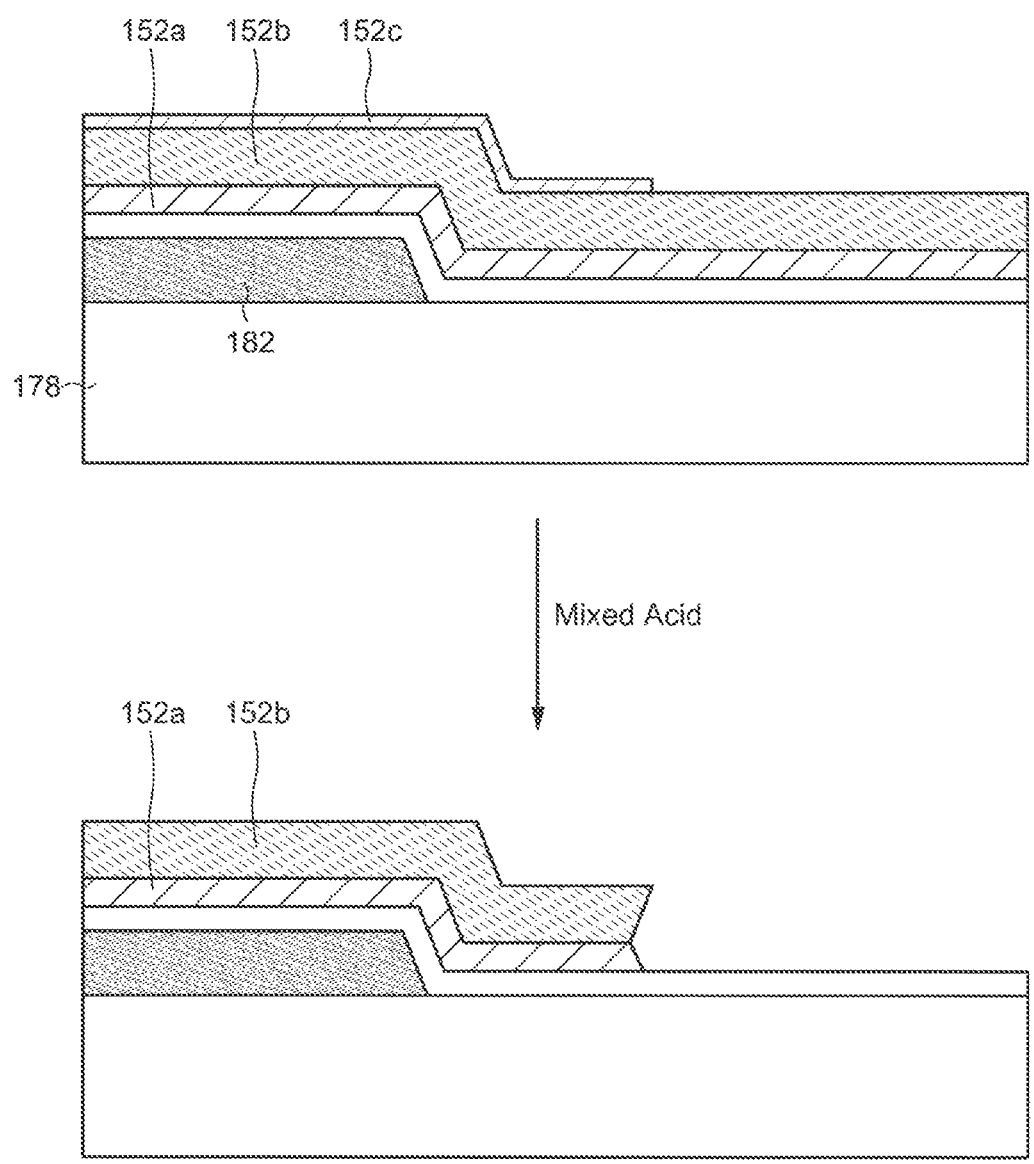
FIG. 14 is a schematic cross-sectional view for explaining a manufacturing method of a display device according to the present invention.

On the other hand, when ITO is used for the first conductive layer 152a, a long time is required to etch the first conductive layer 152a and the second conductive layer 152b because the etching rate of ITO in a mixed acid is lower than that of IZO. In this case, the thin third conductive layer 152c and the thick first conductive layer 152a are etched at substantially the same etching rate, and the third conductive layer 152c disappears as shown in FIG. 14. Hence, the EL layer 154 is in direct contact with the second conductive layer 152b, which causes a large influence on the carrier-injection property and the like.

Figure 15:
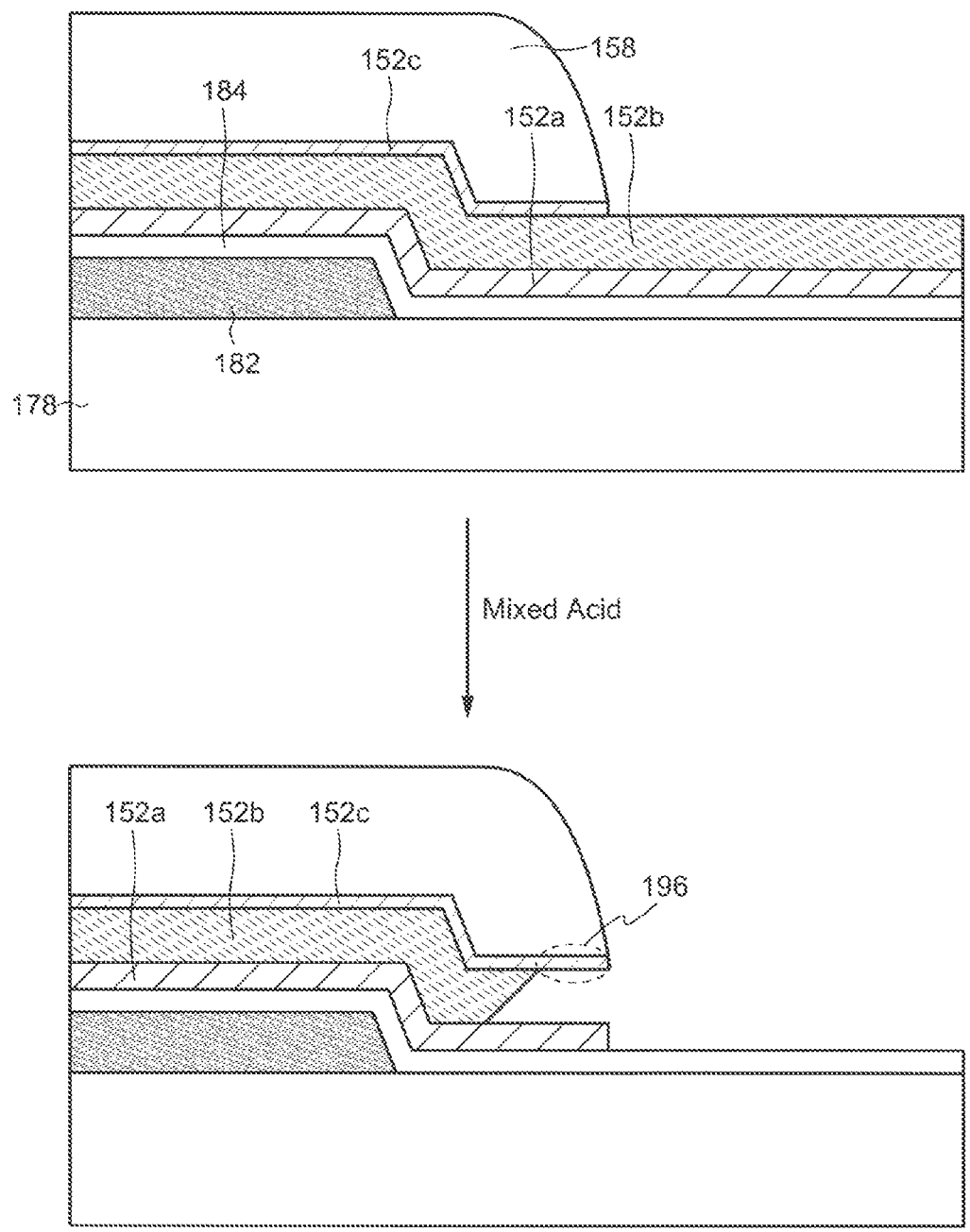
FIG. 15 is a schematic cross-sectional view for explaining a manufacturing method of a display device of a comparable example.

In the case where the modified example is applied after patterning the third conductive layer 152c, that is, in the case where the resist 158 is not removed after patterning the third conductive layer 152c and the first conductive layer 152a and the second conductive layer 152b are patterned with a mixed acid, the third conductive layer 152c covered by the resist 158 can be left as shown in FIG. 15. However, the long etching time required for the etching of the first conductive layer 152a causes swelling and peeling of the resist 158, resulting in a reduction of patterning accuracy.

Additionally, side etching of the second conductive layer 152b cannot be ignored due to the prolonged etching time, and the edge portion of the second conductive layer 152b shifts inside the edge portions of the first conductive layer 152a and the third conductive layer 152c as shown in FIG. 15. As a result, a part of the third conductive layer 152c protrudes from the edge portion of the second conductive layer 152b, resulting in the formation of a shape like a visor in the second conductive layer 152b.

If such a visor 196 is broken and left as a conductive foreign object over the first substrate 102 in the following processes, the visor 196 leads to a defect caused by a short circuit between adjacent pixels 152, and a short circuit between the pixel electrode 152 and the opposing electrode 156, and the like. As a result, the yield and reliability of the display device 100 are reduced.

Figure 16:
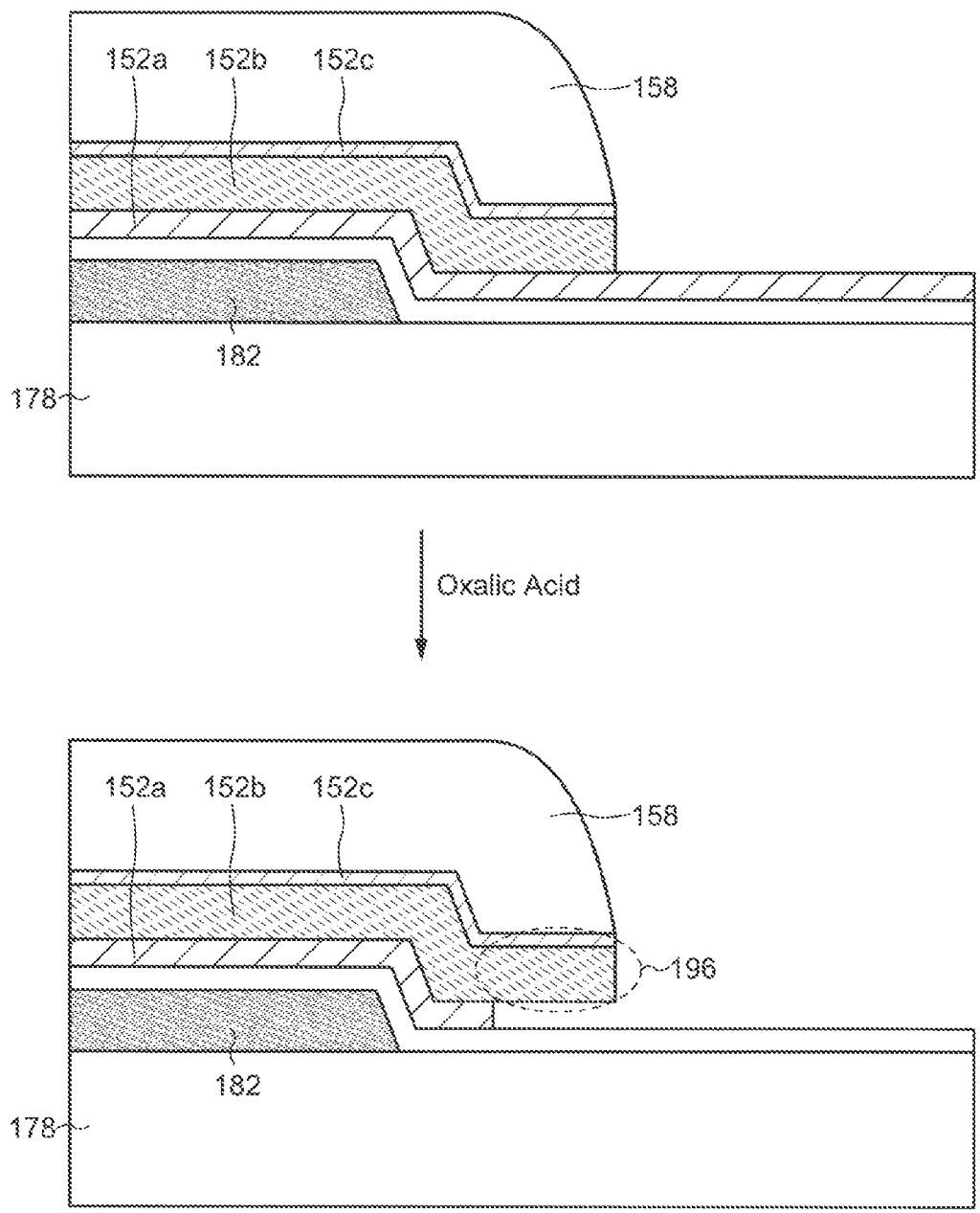
FIG. 16 is a schematic cross-sectional view for explaining a manufacturing method of a display device of a comparable example.

On the other hand, the second conductive layer 152b can be selectively etched as shown in FIG. 16 by conducting etching with a mixed acid in a short time after patterning the third conductive layer 152c with the resist 158 unremoved (see the upper diagram in FIG. 15). This is because silver included in the second conductive layer 152b has a higher etching rate in a mixed acid compared with ITO. After that, the first conductive layer 152a is etched by using oxalic acid, by which the first conductive layer 152a can be patterned. In this case, however, the inventors experimentally confirmed that the side etching of the first conductive layer 152a proceeds, and the side surface of the first conductive layer 152a is significantly shifted from the side surface of the second conductive layer 152b as shown in FIG. 16. When such a structure is formed, the visor 196 may be detached and attached to another location to cause the short-circuit defect resulting in a dark spot, which leads to a decrease of the yield and reliability. Hence, compared with the case of using ITO, a high yield is attained by using IZO for the first conductive layer 152a as described in the present embodiment.

As described above, the use of the manufacturing method of the pixel electrode 152 of the present embodiment enables production of the display device 100 having high reliability at a high yield. Additionally, the optical design of the light-emitting element 150 can be readily achieved in each pixel 106 without a reduction of emission efficiency due to the small thickness of the third conductive layer 152c. Accordingly, the light-emitting elements 150 with excellent color purity can be arranged, and a display device capable of providing a high-quality image can be produced.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display devices having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
 a pixel including a pixel electrode, an electroluminescence layer over the pixel electrode, and an opposing electrode over the electroluminescence layer, the pixel electrode comprising:
  a first conductive layer including a conductive oxide containing indium and zinc;
  a second conductive layer over the first conductive layer, the second conductive layer containing silver; and
  a third conductive layer over the second conductive layer, the third conductive layer including a conductive oxide containing indium and tin,
 wherein a thickness of the first conductive layer is equal to or more than twice a thickness of the third conductive layer and equal to or less than five times the thickness of the third conductive layer.

2. The display device according to claim 1, wherein the thickness of the first conductive layer is equal to or more than 50 nm and equal to or less than 100 nm.

3. The display device according to claim 1, wherein the thickness of the third conductive layer is equal to or more than 10 nm and equal to or less than 20 nm.

4. The display device according to claim 1,
 wherein the first conductive layer has a taper structure, and
 the third conductive layer has a reverse taper structure.

5. The display device according to claim 1,
 wherein the pixel further comprises a partition wall covering an edge portion of the pixel electrode and having an opening portion exposing the pixel electrode, and
 an edge portion of the first conductive layer and an edge portion of the second conductive layer are closer to the opening portion than an edge portion of the third conductive layer.

6. A method for manufacturing a display device, the method comprising:
 forming a pixel electrode over an insulating film including nitrogen, oxygen, and silicon;
 forming an electroluminescence layer over the pixel electrode; and forming an opposing electrode over the electroluminescence layer,
wherein the formation of the pixel electrode comprises:
  forming a first conductive layer including a conductive oxide containing indium and zinc;
  forming a second conductive layer over the first conductive layer, the second conductive layer including silver;
  forming a third conductive layer over the second conductive layer, the third conductive layer including a conductive oxide containing indium and tin;
  forming a resist over the third conductive layer;
  etching the third conductive layer with oxalic acid using the resist as a mask;
  removing the resist; and
  etching the first conductive layer and the second conductive layer with an aqueous solution including nitric acid, acetic acid, and phosphoric acid using the third conductive layer as a mask.

7. The method according to claim 6, wherein the formation of the pixel electrodes is performed so that:
  a thickness of the first conductive layer is equal to or more than 50 nm and equal to or less than 100 nm; and
  a thickness of the third conductive layer after etching the first conductive layer and the third conductive layer is equal to or more than 10 nm and equal to or less than 20 nm.

8. The method according to claim 6, wherein the etching of the first conductive layer and the second conductive layer is performed so that the first conductive layer has a taper structure, and the second conductive layer has a reverse taper structure.

9. The method according to claim 6, further comprising forming a partition wall covering an edge portion of the pixel electrode and having an opening portion exposing the pixel electrode,
  wherein the etching of the first conductive layer and the second conductive layer is performed so that an edge portion of the first conductive layer and an edge portion of the second conductive layer are closer to the opening portion than an edge portion of the third conductive layer.

10. A method for manufacturing a display device, the method comprising:
  forming a pixel electrode over an insulating film including nitrogen, oxygen, and silicon;
  forming an electroluminescence layer over the pixel electrode; and
  forming an opposing electrode over the electroluminescence layer,
  wherein the formation of the pixel electrode comprises:
    forming a first conductive layer including a conductive oxide containing indium and zinc;
    forming a second conductive layer over the first conductive layer, the second conductive layer including silver;
    forming a third conductive layer over the second conductive layer, the third conductive layer including a conductive oxide containing indium and tin,
    forming a resist over the third conductive layer;
    etching the third conductive layer with oxalic acid using the resist as a mask; and
    etching the first conductive layer and the second conductive layer with an aqueous solution including nitric acid, acetic acid, and phosphoric acid using the third conductive layer as a mask.

11. The method according to claim 10, wherein the formation of the pixel electrodes is performed so that:
  a thickness of the first conductive layer is equal to or more than 50 nm and equal to or less than 100 nm; and
  a thickness of the third conductive layer after etching the first conductive layer and the second conductive layer is equal to or more than 10 nm and equal to or less than 20 nm.

12. The method according to claim 10, wherein the etching of the first conductive layer and the second conductive layer is performed so that the first conductive layer has a taper structure, and the second conductive layer has a reverse taper structure.

13. The method according to claim 10, further comprising forming a partition wall covering an edge portion of the pixel electrode and having an opening portion exposing the pixel electrode,
  wherein the etching of the first conductive layer and the second conductive layer is performed so that an edge portion of the first conductive layer and an edge portion of the second conductive layer are closer to the opening portion than an edge portion of the third conductive layer.

* * * * *